United States Patent
Salazar et al.

(10) Patent No.: US 7,787,243 B2
(45) Date of Patent: Aug. 31, 2010

(54) RETRACTABLE CARD ADAPTER

(75) Inventors: Jeffrey A. Salazar, Belmont, CA (US);
Robert A. Howard, Palo Alto, CA (US);
Jonathan R. Harris, Menlo Park, CA (US); Daren W. Hebold, Mountain View, CA (US)

(73) Assignee: SanDisk Corporation, Milpitas, CA (US)

( * ) Notice: Subject to any disclaimer, the term of this patent is extended or adjusted under 35 U.S.C. 154(b) by 10 days.

(21) Appl. No.: 12/371,859

(22) Filed: Feb. 16, 2009

(65) Prior Publication Data
US 2009/0201638 A1    Aug. 13, 2009

Related U.S. Application Data

(62) Division of application No. 11/422,313, filed on Jun. 5, 2006, now Pat. No. 7,492,601, which is a division of application No. 10/133,791, filed on Apr. 26, 2002, now Pat. No. 7,092,256.

(51) Int. Cl.
*H05K 5/00* (2006.01)
*H05K 7/00* (2006.01)
*H01R 13/44* (2006.01)
*H01R 13/60* (2006.01)

(52) U.S. Cl. .................. 361/679.31; 361/752; 439/131; 439/652

(58) Field of Classification Search .......... 361/679.31, 361/752; 439/131, 625
See application file for complete search history.

(56) References Cited

U.S. PATENT DOCUMENTS

| 4,555,619 A | 11/1985 | Anderson |
| 5,155,663 A | 10/1992 | Harase |

(Continued)

FOREIGN PATENT DOCUMENTS

DE    202 07 720 U 1    9/2002

(Continued)

OTHER PUBLICATIONS

Notice of Allowance and Fee(s) Due for U.S. Appl. No. 11/422,313 (Dec. 17, 2008).

(Continued)

*Primary Examiner*—Jayprakash N Gandhi
*Assistant Examiner*—Anthony M Haughton
(74) *Attorney, Agent, or Firm*—Jenkins, Wilson, Taylor & Hunt, P.A.

(57) ABSTRACT

Methods and apparatus for interfacing a memory device with a host device are disclosed. According to one aspect of the present invention, an apparatus which enables a non-volatile memory device to communicate with a host device includes a body and an element. The body has a boundary, and the element is arranged to move at least partially within the body. The element includes an interface which may be coupled to the host device when the element is in a first position with respect to the body. The element is also arranged to receive the non-volatile memory device and to move the non-volatile memory device and the interface with respect to the body. In one embodiment, when the element is in the first position with respect to the body, the interface at least partially extends past the boundary associated with the body.

7 Claims, 8 Drawing Sheets

U.S. PATENT DOCUMENTS

| | | |
|---|---|---|
| D361,989 S | 9/1995 | Cox |
| 5,457,601 A | 10/1995 | Georgopulos et al. |
| 5,486,687 A | 1/1996 | Le Roux |
| 5,603,629 A | 2/1997 | DeFrasne et al. |
| 5,752,857 A | 5/1998 | Knights |
| 5,815,426 A | 9/1998 | Jigour et al. |
| 5,887,145 A | 3/1999 | Harari et al. |
| 5,969,333 A | 10/1999 | Barthelemy et al. |
| 5,984,708 A | 11/1999 | Yu |
| 5,986,891 A | 11/1999 | Sugimoto |
| 6,040,622 A | 3/2000 | Wallace |
| 6,069,795 A | 5/2000 | Klatt et al. |
| 6,097,605 A | 8/2000 | Klatt et al. |
| 6,121,681 A | 9/2000 | Tanaka et al. |
| 6,137,710 A | 10/2000 | Iwasaki et al. |
| 6,151,652 A | 11/2000 | Kondo et al. |
| D436,919 S | 1/2001 | Wakefield et al. |
| 6,176,721 B1 | 1/2001 | Gottardo et al. |
| 6,181,564 B1 | 1/2001 | Furusho |
| 6,234,810 B1 | 5/2001 | Schnell et al. |
| 6,243,686 B1 | 6/2001 | McPherson et al. |
| D444,473 S | 7/2001 | Okamoto et al. |
| D445,111 S | 7/2001 | Okamoto et al. |
| 6,256,692 B1 | 7/2001 | Yoda et al. |
| 6,266,724 B1 | 7/2001 | Harari et al. |
| D446,525 S | 8/2001 | Okamoto et al. |
| 6,279,114 B1 | 8/2001 | Toombs et al. |
| D447,482 S | 9/2001 | Lin |
| 6,295,206 B1 | 9/2001 | Kondo et al. |
| 6,312,268 B1 | 11/2001 | Chih-Kai |
| 6,325,291 B1 | 12/2001 | Eisele et al. |
| 6,330,151 B1 | 12/2001 | Bates, III |
| D452,863 S | 1/2002 | Madsen et al. |
| 6,341,728 B1 | 1/2002 | Kondo et al. |
| 6,353,870 B1 | 3/2002 | Mills et al. |
| 6,381,143 B1 | 4/2002 | Nakamura |
| 6,385,677 B1 | 5/2002 | Yao et al. |
| 6,422,469 B1 | 7/2002 | Pernet |
| 6,435,409 B1 | 8/2002 | Hu |
| 6,438,638 B1 | 8/2002 | Jones et al. |
| 6,439,464 B1 | 8/2002 | Fruhauf et al. |
| 6,483,038 B2 | 11/2002 | Lee et al. |
| D470,499 S | 2/2003 | Salazar et al. |
| 6,518,927 B2 | 2/2003 | Schremmer et al. |
| 6,524,137 B1 * | 2/2003 | Liu et al. ............... 439/638 |
| 6,561,421 B1 | 5/2003 | Yu |
| 6,567,273 B1 | 5/2003 | Liu et al. |
| 6,580,615 B1 | 6/2003 | Nakanishi et al. |
| 6,590,615 B2 | 7/2003 | Murakami et al. |
| 6,590,778 B1 | 7/2003 | Hojo et al. |
| 6,594,154 B1 | 7/2003 | Brewer et al. |
| 6,612,498 B1 | 9/2003 | Lipponen et al. |
| 6,612,853 B2 | 9/2003 | Wu |
| 6,617,673 B2 | 9/2003 | Lee et al. |
| 6,623,304 B2 | 9/2003 | Harasawa et al. |
| 6,632,097 B2 | 10/2003 | Chang |
| 6,646,885 B1 | 11/2003 | Yu et al. |
| 6,650,534 B2 * | 11/2003 | Tree ................. 361/679.4 |
| 6,669,487 B1 | 12/2003 | Nishizawa et al. |
| 6,676,420 B1 | 1/2004 | Liu et al. |
| 6,733,340 B2 | 5/2004 | Nishio et al. |
| 6,738,259 B2 | 5/2004 | Le et al. |
| 6,743,030 B2 | 6/2004 | Lin et al. |
| 6,763,410 B2 | 7/2004 | Yu |
| 6,820,148 B1 | 11/2004 | Cedar et al. |
| 6,883,718 B1 | 4/2005 | Le et al. |
| 6,890,188 B1 | 5/2005 | Le |
| 6,901,457 B1 | 5/2005 | Toombs et al. |
| 6,908,038 B1 | 6/2005 | Le |
| 6,979,210 B2 | 12/2005 | Regen et al. |
| 7,004,780 B1 | 2/2006 | Wang |
| 7,092,256 B1 | 8/2006 | Salazar et al. |
| 7,104,809 B1 | 9/2006 | Huang |
| 7,152,801 B2 | 12/2006 | Cuellar et al. |
| D535,297 S | 1/2007 | Cuellar et al. |
| D542,797 S | 5/2007 | Cuellar et al. |
| 7,310,692 B2 | 12/2007 | Miller et al. |
| 7,340,540 B2 | 3/2008 | Miller et al. |
| 7,355,860 B2 | 4/2008 | Miller et al. |
| 7,364,090 B2 | 4/2008 | Cuellar et al. |
| 7,487,265 B2 | 2/2009 | Miller et al. |
| 7,492,601 B2 | 2/2009 | Salazar et al. |
| 7,554,813 B2 | 6/2009 | Miller et al. |
| 2001/0009505 A1 | 7/2001 | Nishizawa et al. |
| 2003/0100203 A1 | 5/2003 | Yen |
| 2003/0212848 A1 | 11/2003 | Liu et al. |
| 2003/0233507 A1 | 12/2003 | Yu et al. |
| 2004/0033726 A1 | 2/2004 | Kao |
| 2004/0033727 A1 | 2/2004 | Kao |
| 2004/0039854 A1 | 2/2004 | Estakhri et al. |
| 2004/0042323 A1 | 3/2004 | Moshayedi |
| 2004/0089717 A1 | 5/2004 | Harari et al. |
| 2005/0037647 A1 | 2/2005 | Le |
| 2005/0037671 A1 | 2/2005 | Yamada et al. |
| 2005/0230483 A1 | 10/2005 | Miller et al. |
| 2005/0230484 A1 | 10/2005 | Cuellar et al. |
| 2006/0084287 A1 | 4/2006 | Miller et al. |
| 2006/0282553 A1 | 12/2006 | Miller et al. |
| 2007/0099511 A1 | 5/2007 | Miller et al. |
| 2007/0274117 A1 | 11/2007 | Salazar et al. |
| 2008/0064272 A1 | 3/2008 | Miller et al. |

FOREIGN PATENT DOCUMENTS

| | | |
|---|---|---|
| DE | 20304040U 1 | 8/2003 |
| DE | 20311679U 1 | 11/2003 |
| EP | 0 891 047 A2 | 1/1999 |
| EP | 1 085 516 A2 | 3/2001 |
| EP | 1 146 428 A1 | 10/2001 |
| EP | 1 333 531 A1 | 8/2003 |
| JP | 2001-307801 A2 | 11/2001 |
| WO | WO 00/70553 A1 | 11/2000 |
| WO | WO 01/84490 A1 | 8/2001 |
| WO | WO 02/13021 A2 | 2/2002 |
| WO | WO 02/15020 A2 | 2/2002 |
| WO | WO 02/19266 A2 | 3/2002 |
| WO | WO 2005/104025 A1 | 11/2005 |
| WO | WO 2005/106781 A1 | 11/2005 |

OTHER PUBLICATIONS

Notice of Allowance and Fee(s) Due for U.S. Appl. No. 10/826,796 (Sep. 18, 2008).
Official Action for U.S. Appl. No. 11/938,950 (Sep. 10, 2008).
Official Action for U.S. Appl. No. 11/422,313 (Aug. 28, 2008).
Notice of Allowance and Fee(s) Due for U.S. Appl. No. 10/826,796 (Jun. 2, 2008).
Notice of Allowance and Fee(s) Due for U.S. Appl. No. 11/422,313 (Apr. 3, 2008).
Response to Rule 312 Communication for U.S. Appl. No. 10/826,796 (Mar. 21, 2008).
Notice of Allowance and Fee(s) Due for U.S. Appl. No. 10/826,796 (Dec. 17, 2007).
Notice of Allowance and Fee(s) Due for U.S. Appl. No. 11/461,731 (Nov. 28, 2007).
Response to Rule 312 Communication for U.S. Appl. No. 11/196,160 (Nov. 9, 2007).
Official Action for U.S. Appl. No. 11/422,313 (Oct. 18, 2007).
Notice of Allowance and Fee(s) Due for U.S. Appl. No. 11/419,172 (Sep. 20, 2007).
Restriction and/or Election Requirement for U.S. Appl. No. 11/422,313 (Jul. 25, 2007).
Notice of Allowance and Fee(s) Due for U.S. Appl. No. 11/196,160 (Jul. 23, 2007).

Notice of Allowance and Fee(s) Due for U.S. Appl. No. 10/826,796 (Jul. 3, 2007).
Official Action for U.S. Appl. No. 11/419,172 (Apr. 3, 2007).
Official Action for U.S. Appl. No. 11/196,160 (Apr. 2, 2007).
Official Action for U.S. Appl. No. 11/461,731 (Feb. 26, 2007).
Official Action for U.S. Appl. No. 10/826,796 (Oct. 12, 2006).
Official Action for U.S. Appl. No. 11/196,160 (Jul. 24, 2006).
EPO/ISA, Notification of Transmittal of the International Preliminary Examination Report in related PCT/US2005/012901, 8 pages (Jun. 12, 2006).
Official Action for U.S. Appl. No. 10/826,796 (Apr. 3, 2006).
Notice of Allowance and Fee(s) Due for U.S. Appl. No. 10/133,791 (Feb. 14, 2006).
EPO/ISA, Notification of Transmittal of the International Search Report and the Written Opinion of the International Searching Authority, or the Declaration in related PCT/US2005/0126951, 9 pages (Sep. 20, 2005).
EPO/ISA, Notification of Transmittal of the International Search Report and the Written Opinion of the International Searching Authority, or the Declaration in related PCT/US2005/012901, 8 pages (Sep. 7, 2005).
Notice of Allowance and Fee(s) Due for U.S. Appl. No. 10/133,791 (Aug. 22, 2005).
Official Action for U.S. Appl. No. 10/133,791 (Jan. 10, 2005).
Restriction and/or Election Requirement for U.S. Appl. No. 10/133,791 (Oct. 4, 2004).
"USB Flash Drive," http://www.pgimemory.com/products-istick.asp, 2 pages (Downloaded Sep. 7, 2004).
"SanDisk Launches Cruzer USB Flash Drives and Cruzer Micro MP3 Companion Player in China, Taiwan and Hong Kong," http://www.sandisk.com/pressrelease/20040407.html, 4 pages (Apr. 9, 2004).
"What is Memory Stick," http://www.memorystick.org/eng/aboutms/family.html, 4 pages (Downloaded Mar. 12, 2004).
"SanDisk Cruzer USB Flash Drives," http://www.sandisk.com/pdf/retail/Cruzer_Family_Brochure_English.pdf, 2 pages (Jan. 20, 2004).
SanDisk Corporation, "SanDisk Standard Grade, CompactFlash and PC Card, Product Manual," Version 1.4, 104 pages (Dec. 2003).
"Identification Cards—Integrated Circuit(s) Cards with Contact, Part 1: Physical Characteristics, Amendment 1: Maximum Height of the IC Contact Surface," ISO/IEC 7816-1, 7 pages (Nov. 15, 2003).
Hughes, "Gadgeteer Hands on Review: Intelligent Stick USB Drive," http://pqi1st.com/reviews/review020404.asp, 3 pages (Nov. 6, 2003).
SanDisk Corporation, "CompactFlash Memory Card Product Manual," Revision 10.1, 97 pages (Sep. 2003).
CompactFlash Association, "CF+ and CompactFlash Specification," Revision 2.0, 137 pages (May 2003).
SanDisk Corporation, "SanDisk miniSD Card Product Manual," Version 1.0, 110 pages (Apr. 2003).
SanDisk Corporation, "MultiMediaCard Product Manual," Revision 5.2, 100 pages (Mar. 2003).
"Information Technology—Identification Cards—Integrated Circuit(s) Cards with Contact, Part 3: Electronic Signals and Transmission Protocols, Amendment 1: Electrical Characteristics and Class Indication for Integrated Circuit(s) Cards Operating at 5 V, 3 V and 1, 8 V," ISO/IEC 7816-3, 10 pages (Jun. 1, 2002).
MMCA Technical Committee, "The Multimedia Card System Specification," Version 3.1, 130 pages (Jun. 2001).
SD Group, "SD Memory Card Specifications, Simplified Version of Part 1, Physical Layer Specification," Version 1.01, 32 pages (Apr. 15, 2001).
SD Group, "Simplified Version of Part 1: Physical Layer Specification," Version 1.01, 32 pages (Apr. 15, 2001).
"PC Card Standard Release 8.0," Personal Computer Memory Card International Association (PCMCIA), vol. 1, pp. iii-34 and vol. 3, pp. iii-70 (Apr. 2001).
Compaq et al., "Universal Serial Bus Specification," Revision 2.0, pp. i-xxvii, 1-24 and 85-11, 117 pages (Apr. 27, 2000).
SD Group, "SD Memory Card Simplified Specifications, Part 1, Physical Layer Specification," Version 0.96, 28 pages (Jan. 2000).
"Information Technology—Identification Cards—Integrated Circuit(s) Cards with Contact, Part 2: Dimensions and Location of the Contacts," ISO/IEC 7816-2, 10 pages (Mar. 1, 1999).
GSM Global System for Mobile Communication, "Digital Cellular Telecommunications System (Phase 2+); Specification of the Subscriber Identity Module—Mobile Equipment (SIM—ME) Interface," GSM 11.11, Version 8.3.0,:170 pages (Release 1999).
"Identification Cards—Integrated Circuit(s) Cards with Contact, Part 1: Physical Characteristics," ISO/IEC 7816-1, 8 pages (Oct. 15, 1998).
"Information Technology—Identification Cards—Integrated Circuit(s) Cards with Contact, Part 3: Electronic Signals and Transmission Protocols," ISO/IEC 7816-3, $2^{nd}$ Edition, 32 pages (Dec. 15, 1997).
"Identification Cards—Physical Charateristics," International Organization for Standardization (ISO) and the International Electrotechnical Commission (IEC), ISO/IEC 7810 standard, second edition, 9 pages (Aug. 15, 1995).
"IEEE Standard for a High Performance Serial Bus," Document No. IEEE 1394-1995, pp. 1-81, 259-260, 336-341, (87 pages) as amended by Document Nos. IEEE 1394a-2000, pp. 1-2 and 24, (11 pages) and IEEE 1394b-2002, pp. 1-2, 35-75 (53 pages).

* cited by examiner

RETRACTABLE CARD ADAPTER

CROSS REFERENCE

This application is a divisional of U.S. patent application Ser. No. 11/422,313, filed Jun. 5, 2006, now U.S. Pat. No. 7,492,601 which is a divisional of U.S. patent application Ser. No. 10/133,791, filed Apr. 26, 2002, now U.S. Pat. No. 7,092,256, the disclosures of each of which are incorporated herein by reference in their entireties.

BACKGROUND OF THE INVENTION

1. Field of Invention

The present invention relates generally to mass digital data storage systems. More particularly, the present invention relates to systems and methods for enabling a flash memory card to interface with a host device.

2. Description of the Related Art

The use of non-volatile memory systems such as flash memory storage systems is increasing due to the compact physical size of such memory systems, and the ability for non-volatile memory to be repetitively reprogrammed. The compact physical size of flash memory storage systems facilitates the use of such storage systems in devices which are becoming increasingly prevalent. Devices which use flash memory storage systems include, but are not limited to, digital cameras, digital camcorders, digital music players, hand-held personal computers, and global positioning devices. The ability to repetitively reprogram non-volatile memory included in flash memory storage systems enables flash memory storage systems to be used and reused.

Some devices, which use flash memory storage systems, e.g., flash memory cards, include slots into which the flash memory cards may be inserted to enable data to be exchanged between a flash memory card and the device. Other devices, however, require the use of an adapter, which accepts a flash memory card and is coupled to a device to enable data to be transferred between the flash memory card and the device. Many adapters include a slot into which a memory card may be inserted, and a connector, which allows the adapter to be connected to a host device. For example, an adapter may include a slot that accepts a memory card such as a Secure Digital card or a MultiMedia card, and a Universal Serial Bus (USB) connector. An adapter that is coupled to a host device is generally effective in enabling data to be read from or written to a memory card inserted within the adapter by the host device.

Often, an adapter is only coupled to a host device when data is to be transferred between the host device and a memory card inserted into the adapter. Decoupling an adapter, e.g., an adapter that includes a USB connector, for a host device when the adapter is not in use enables a USB port associated with the host device to be freed for other uses.

When an adapter is decoupled from a host device, the connector on the adapter is typically exposed, as conventional adapters typically include connectors which protrude from the adapter. An exposed connector may be damaged relatively easily and, hence, may affect the performance of the adapter. In the event that there is a significant amount of damage to an exposed connector, the adapter may no longer usable. To protect a connector from damage caused by particles becoming lodged in the connector or damage that results in pins associated with the connector being bent, caps are sometimes placed over the connector when the adapter is not in use. In other words, a cap may be used to cover the pins of a connector. While a cap is generally effective in protecting a connector, a cap may be accidentally dislodged from the connector when the adapter is being transported, thereby exposing the connector to elements which may cause damage to the adapter. In addition, even with a cap in place, a connector may be damaged, e.g., the housing of the connector may be bent, when excessive force is applied to the connector.

Like a connector, a memory card may be damaged if the memory card is not properly protected. For example, if a memory card is being transported when the memory card is not protected by a sleeve or a case, the pins of the memory card may be damaged. In the event that the pins of a memory card sustain relatively significant damage, then the memory card may become unusable, and substantially any data stored on the memory card may be lost. It is fairly common for a memory card to remain inserted in an adapter when the memory card is not in use, e.g., a user may leave a memory card in an adapter when the adapter is uncoupled from a port on a host device. However, many adapters are arranged such that when a memory card is inserted in an adapter, part of the memory card may protrude from the adapter. When a memory card inserted in an adapter partially protrudes out of the adapter, the memory card may be damaged when the adapter is being moved from one location to another location.

Since adapters which allow memory cards to interface with host devices are highly portable, adapters are often transported. As such, when a part of a memory card inserted in an adapter and a connector that is a part of the adapter are exposed, the memory card and the connector may be damaged. Damage incurred by a memory card may be disastrous when the contents stored in memory of the memory card are effectively lost, while damage incurred by a connector may affect the reliability of the connector and, hence, the adapter, as discussed above.

Therefore, what is needed is a method and a system which protects both a memory card inserted into an adapter and a connector of the adapter from being damaged when the adapter is being transported. That is, what is desired is an adapter which is configured to protect both a memory card inserted into the adapter and a connector of the adapter when the adapter is not coupled to a host device.

SUMMARY OF THE INVENTION

The present invention relates to a system and a method for interfacing a memory device with a host device. According to one aspect of the present invention, an apparatus which enables a non-volatile memory device to communicate with a host device includes a body and an element. The body has a boundary, and the element is arranged to move at least partially within the body. The element includes an interface which may be coupled to the host device when the element is in a first position with respect to the body. The element is also arranged to receive the non-volatile memory device and to move the non-volatile memory device and the interface with respect to the body. In one embodiment, when the element is in the first position with respect to the body, the interface at least partially extends past the boundary associated with the body.

In another embodiment, the element includes a receiver that receives the non-volatile memory device. In such an embodiment, when the element is in a second position with respect to the body, the interface and the receiver are both positioned substantially within the boundary. The receiver may be a memory card socket and the interface may be a connector, e.g., a universal serial bus connector.

An adapter which includes a retractable connector may be relatively safely transported when the connector is retracted.

When the connector is retracted, the connector may effectively be protected, since the connector is effectively not exposed and, hence, may not accidentally be bent or otherwise damaged. An adapter which includes a retractable connector may also be arranged to protect a memory card inserted into the adapter and, as a result, protect both the memory card and the connector when the adapter is not in use. When the adapter is to be used, the connector may be extended such that it may be interfaced with an appropriate port on a host device such as a computer.

According to another aspect of the present invention, an adapter that receives a memory card and may be coupled to a host device includes a body and a sliding element. The body has a boundary, e.g., external edges or an outline which effectively defines a footprint of the body. The sliding element includes a receptacle that holds the memory card and a connector that allows the adapter to be coupled to the host device. The sliding element is positioned at least partially within the body, and is used to move the connector such that when the sliding element is in a first position, the connector is substantially within the boundary. When the sliding element is in a second position, the connector at least partially extends past the boundary.

In one embodiment, the sliding element includes a flexible portion that moves, e.g., flexes, when a force is applied to the flexible portion. When the flexible portion moves, the sliding element is allowed to move. In another embodiment, the body includes a first component of a detent mechanism and the sliding element includes a second component of the detent mechanism. The detent mechanism substantially holds the sliding element in the first position.

According to still another aspect of the present invention, an adapter includes a body, a connector that is arranged to interface with an external device, and a receptacle that is arranged to substantially hold a memory device. The adapter also includes means for enabling information to be passed between the connector and the memory device, means for moving the connector, and means for positioning the receptacle. The means for moving the connector include means for substantially retracting the connector within the body, and the means for positioning the receptacle are arranged to position the receptacle such that the receptacle is arranged to receive the memory device when the connector is substantially retracted within the body.

In accordance with yet another aspect of the present invention, a method of interfacing a non-volatile memory device with a host device using an adapter to enable information to be transferred between the non-volatile memory device and the host device includes inserting a non-volatile memory device into a receptacle and retracting the non-volatile memory device into the adapter. The adapter includes a receptacle that receives the non-volatile memory device and a connector that interfaces with the host device. The connector is substantially retracted within the adapter when the non-volatile memory device is inserted into the receptacle. When the non-volatile memory device is retracted, the receptacle is moved within the adapter. In one embodiment, the method also includes moving the connector within the adapter when the non-volatile memory device is being retracted.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

An adapter or a reader which may be used to enable communications to occur between a non-volatile memory device, e.g., a flash memory card, and a host device may be exposed to various situations which may result in damage being inflicted on the non-volatile memory device or to a connector which enables the adapter to be coupled to the host device. To minimize the likelihood that damage may occur, particularly when the adapter is in transit or is otherwise being moved, a cap may be placed over the otherwise exposed connector to prevent the connector from being damaged. While the use of a cap may protect the connector from being damaged, a cap is likely to be accidentally dislodged. If a protective cap is dislodged, the connector will generally be exposed and, hence, unprotected.

The use of an adapter which includes a retractable connector enables the connector to be protected when the connector is retracted within a body of the adapter. The connector may generally be retracted when the adapter is not coupled to a host device, e.g., when the adapter is being transported between locations. By retracting the connector when the connector is not coupled to a host device, the connector may be protected from damage without necessitating the use of a cap or a similar separate piece to effectively cover or shield the connector. Hence, the need to keep track of a separate piece which may be used to protect the connector may essentially be eliminated.

An adapter which includes a retractable connector may also be arranged to retract a memory card. Specifically, in one embodiment, an adapter may include three positions or configurations. In a first configuration, the connector may be retracted while the memory card protrudes from the adapter. Such a configuration may be suitable for use for loading the memory card to and unloading the memory card from the adapter. In a second configuration, both the connector and the memory card may be retracted within the adapter, i.e., both the connector and the memory card may effectively be covered or shielded within the adapter, such that neither the connector nor the memory card is exposed when the adapter is disconnected from a host device. Finally, in a third configuration, the connector is exposed such that the connector may be coupled to a port on a host device, while the memory card is retracted.

Figure 1:
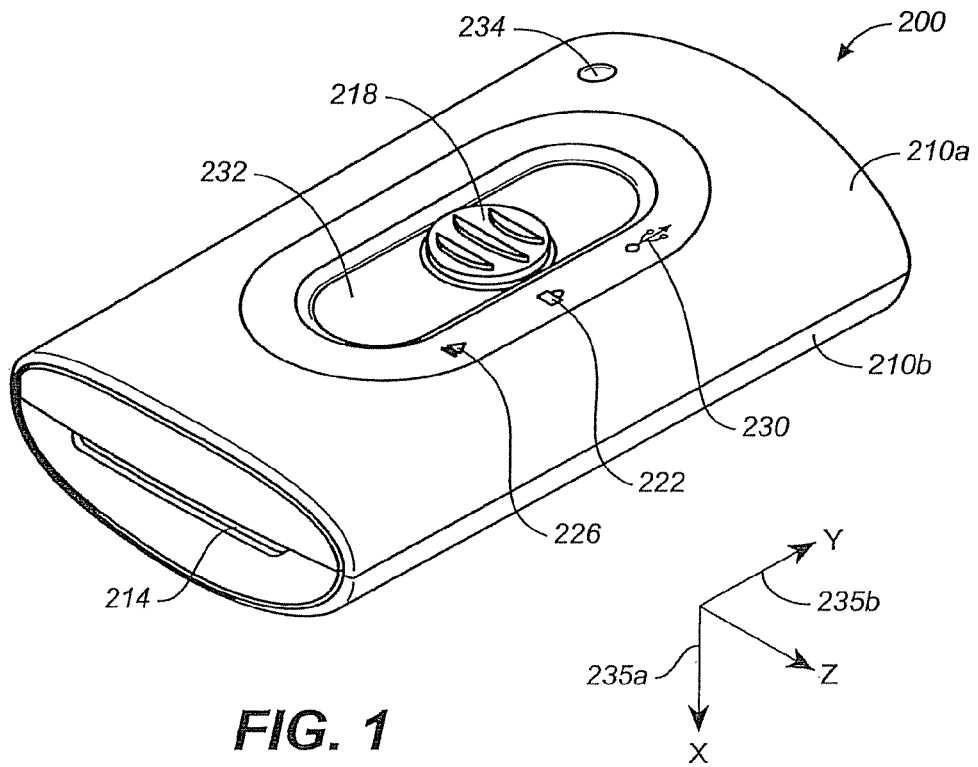
FIG. 1 is a diagrammatic representation of a three-position adapter in accordance with an embodiment of the present invention.

Referring to FIG. 1, a three-position adapter will be described in accordance with an embodiment of the present invention. A three-position adapter 200 includes a body 210 which generally includes a top portion 210a and a bottom portion 210b. Body 210 includes a slot opening 214 which is arranged to accept a memory card (not shown). A switch 218 is arranged to be moved substantially within body 210 to enable adapter 200 to be configured in one of three positions. Switch 218 protrudes through an opening 232 and may move within opening 232. To move switch 218 within opening 232, a force may be applied to switch 218 in an x-direction 235a, and switch 218 may effectively be pushed in a y-direction 235b while the force is applied in x-direction 235a. As shown, switch 218 is positioned in a lock position as indicated at 222. When switch 218 is in a lock position, a connector (not shown) associated with adapter 200 is retracted within body 210, and any memory card accepted within slot opening 214 is retracted within body 210. The configuration of adapter 200 in a lock position 210 will be described in more detail below with respect to FIG. 4b.

In the described embodiment, switch 218 may be moved within body 210 such that in lieu of being positioned in lock position 222, switch 218 may be positioned in a loading position as indicated at 226 or switch 218 may be positioned in a "use" position as indicated at 230. When adapter 200 is configured in a loading position, a memory card may be loaded into slot opening 214, and a connector associated with adapter 200 may be retracted within body 210. Alternatively, when adapter 200 is configured in a use position, the connector associated with adapter 200 generally protrudes from body 210. The configuration of adapter 200 in a load or loading position will be described below with respect to FIG. 4a, while the configuration of adapter 200 in a use position will be described below with respect to FIG. 4c.

An opening 234 defined within body 210 is arranged to enable a light, e.g. an LED, to be viewed to indicate when data is being transferred to or from a memory card inserted within body 210. That is, opening 234 enables a light within body 210 that is illuminated when data a memory card within body 210 is in use to be viewed. Such a light may allow a user to easily determine when a memory card is in use and, hence, when it is safe to decouple adapter 200 from a host device.

Generally, the components of adapter 200 which enable adapter 200 to be configured in three positions are mechanical components. In other words, the assembly used to enable switching to occur between the three adapter positions is substantially mechanical. It should be appreciated, however, that other types of components, e.g., electrical components, may also be used either in addition to or in place of mechanical components to facilitate switching between the three adapter positions.

Figure 3:
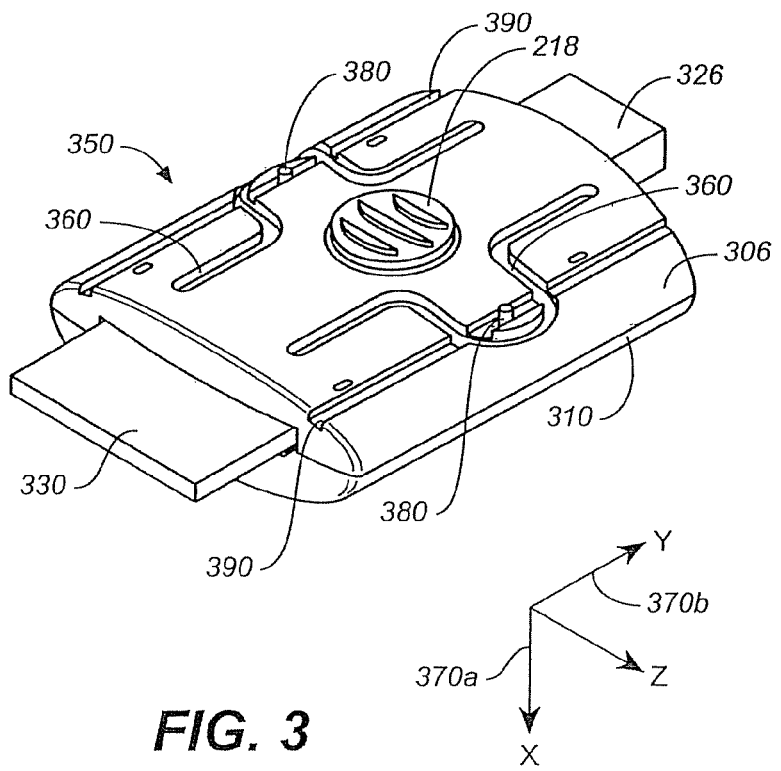
FIG. 3 is a diagrammatic representation of an overall sliding element which includes a top sliding element, e.g., top sliding element 306 of FIG. 2, and a bottom sliding element, e.g., bottom sliding element 310 of FIG. 2, in accordance with an embodiment of the present invention.
Figure 2:
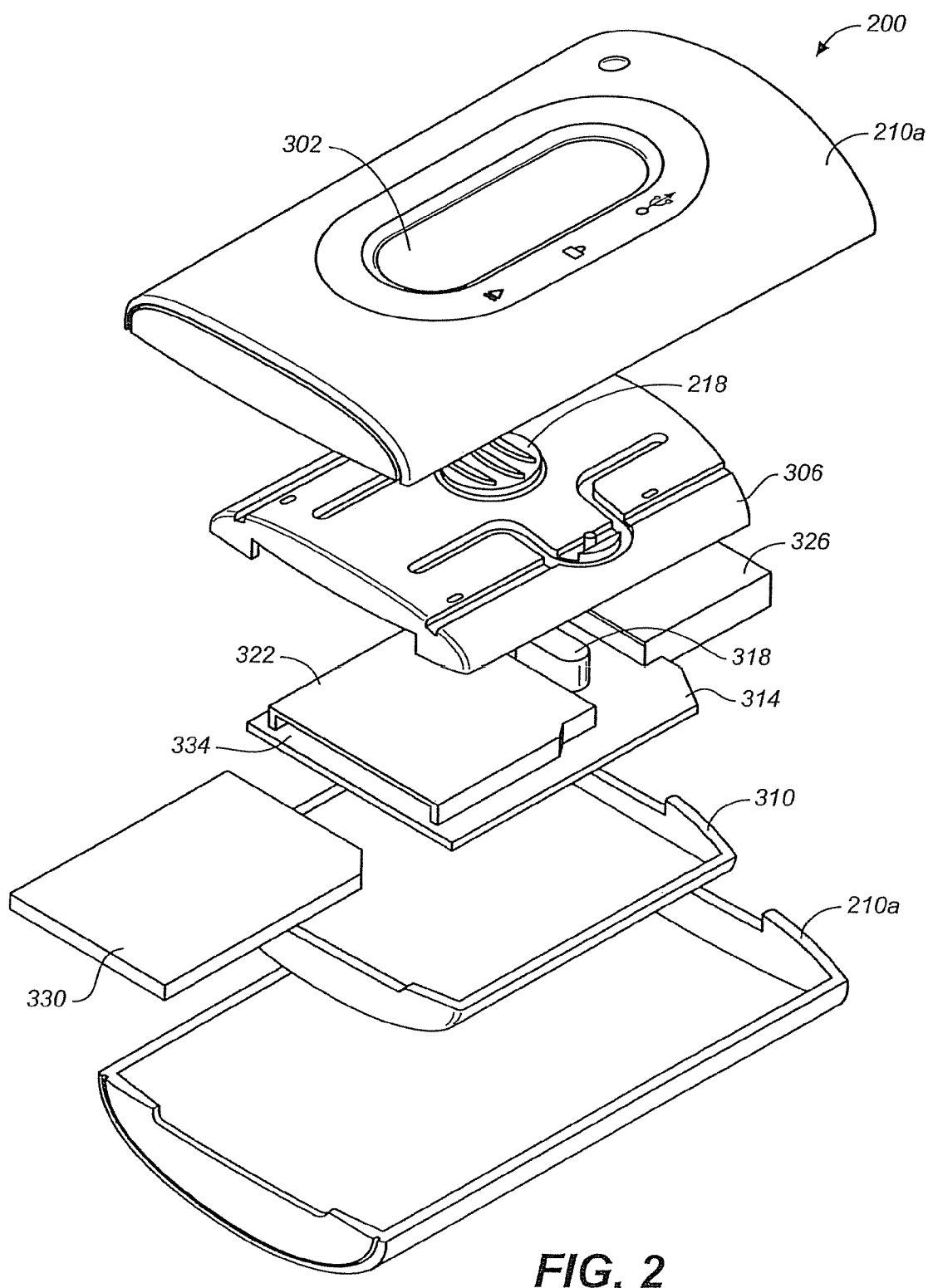
FIG. 2 is a diagrammatic exploded representation of adapter 200 in accordance with an embodiment of the present invention.

FIG. 2 is a diagrammatic exploded representation of adapter 200 in accordance with an embodiment of the present invention. Adapter 200, as previously mentioned, includes top body portion 210a and bottom body portion 210b. An opening 302 is defined within top body portion 210a to enable switch 218 to be accessed and, hence moved into different positions. Switch 218 is part of a top sliding element 306 which is arranged to be coupled to a bottom sliding element 310 to form an overall sliding element which is arranged to slide within the body formed when top body portion 210 is coupled to bottom body portion 210b. That is, an overall sliding element, e.g. overall sliding element 350 of FIG. 3, is formed from top sliding element 306 and bottom sliding element 310. When switch 218 is moved within opening 302, top sliding element 306 and bottom sliding element 310 move along with switch 218.

Returning to FIG. 2, a circuit board 314, which is arranged to be housed between top sliding element 306 and bottom sliding element 310, includes electrical components, e.g., an electrical component 318, a card socket 322, a connector 326. Electrical components and contacts associated with circuit board 314 enable a memory card 330 that is inserted within card socket 322 to be accessed by a host device coupled to connector 326. In the described embodiment, card socket 322 is arranged to accept memory card 330 and to hold memory card within card socket 322. Typically, card socket 322, which includes a slot 334 through which memory card 330 may be inserted, is formed from a material such as a liquid crystal polymer (LCP) that enables memory card 330 to be held within card socket 322 by a press fit. The components, including card socket or receptacle 322, that are coupled to circuit board 314 will be discussed below with respect to FIGS. 6 and 7.

As circuit board 314 is arranged between top sliding element 306 and bottom sliding element 310, when the overall sliding element formed by top sliding element 306 and bottom sliding element 310 moves, circuit board 314 also moves. When circuit board 314 moves, connector 326 and memory card 330, when inserted in card socket 322, also move. FIG. 3 is a diagrammatic representation of an overall sliding element which includes top sliding element 306 and bottom sliding element 310 in accordance with an embodiment of the present invention. An overall sliding element 350 effectively supports memory card 330 and connector 326, as circuit board 314 (not shown), which is housed within overall sliding element 350, includes connector 326 and card socket 322, which holds memory card 330.

Overall sliding element 350, which may be formed from a material such as ABS plastic, includes openings 360 which are shaped to enable switch 218 to be substantially depressed when force is applied to switch 218. That is, openings 360 are arranged to allow at least a portion of top sliding element 306 to deflect in an x-direction 370a such that overall sliding element 350 may be pushed and, hence, translated along a y-direction 370b. Openings 360 provide the ability for a top surface over overall sliding element 350 or, more specifically, a top surface of top sliding element 306 to flex. The ability to flex allows overall sliding element 350 to move within body 210 of FIG. 1a when flexed, and to be latched within body 210 when not flexed, i.e., when in a default position.

When force is applied to switch 218 and overall sliding element 350 is pushed along y-direction 370b, nubs 380 that are situated in channels 390 interface with a guiding rail (not shown) associated with an underside of top body portion 210a of FIG. 1. Nubs 380, channels 390, and the guiding rail associated with top body portion 210a of FIG. 1 effectively cooperate to form a detent mechanism which enables overall sliding element 350 to be positioned, and effectively locked, in appropriate positions with respect to body 210. One suitable detent mechanism will be described below with respect to FIGS. 5a and 5b.

In the described embodiment, overall sliding element 350 is effectively the mechanism which is used to retract and to extend a memory card and a connector. That is, overall sliding element 350 serves as a coupling which enables the positioning of a memory card and a connector to be altered with respect to a body of an adapter, e.g., body 210 of adapter 200 of FIG. 1. The positioning of a memory card and a connector which move with overall sliding element 350 is altered when force or a pressure is applied to a switch 218, or a contact point, to enable overall sliding element 350 to slide. As overall sliding element 350 slides within a body of an adapter such as body 210 of adapter 200 of FIG. 1, the position of connector 326 with respect to body 210 is changes, as does the position of memory card 330 that is held by overall sliding element 350.

Figure 4A:
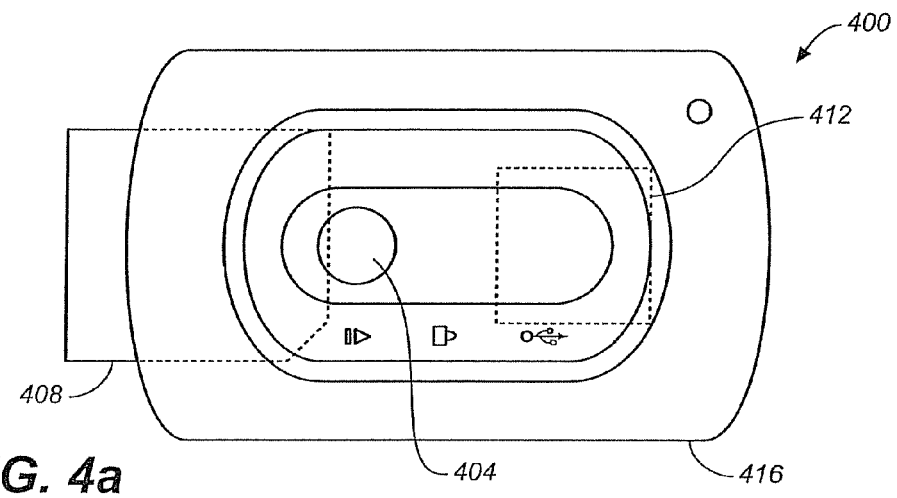
FIG. 4a is a diagrammatic representation of a memory card and a connector in a loading position with respect to the body of a three-position adapter in accordance with an embodiment of the present invention.

Referring next to FIG. 4a, the positioning of a memory card and a connector in a loading position with respect to the body of a three-position adapter will be described in accordance with an embodiment of the present invention. When an adapter 400 is oriented in a loading position, as indicated by the positioning of a switch or a button 404, a memory card 408 may be loaded into adapter 400 such that memory card 408 at least partially protrudes from adapter 400 or, more specifically, a body 416 of adapter 400. For ease of illustration, only body 416, button 404, memory card 408, and a connector 412 are indicated, although it should be understood that button 404, memory card 408, and connector 412 are coupled to a sliding element (not shown) which houses a circuit board (not shown).

When adapter 400 is in a loading position or configuration, connector 412 is retracted within body 416 such that connector 412 is effectively protected. That is, substantially no portion of connector 412 extends past the outline of body 416. The loading position enables memory card 408 to be loaded into adapter 400 or, more specifically, a receptacle within adapter 400, e.g. a card socket such as card socket 322 of FIG. 2. A portion of memory card 408 protrudes from adapter 400 once memory card 308 is loaded into adapter 400 to enable memory card 408 to be gripped. That is, memory card 408 extends past the outline of body 416 once memory card 408 is loaded into adapter 400 and adapter 400 is in a locating position such that a user may readily access memory card 400. Physical access to memory card 400 may be needed, for example, to enable a user to substantially decouple memory card 408 from adapter 400 when memory card 408 is to be removed from adapter 400

Figure 4B:
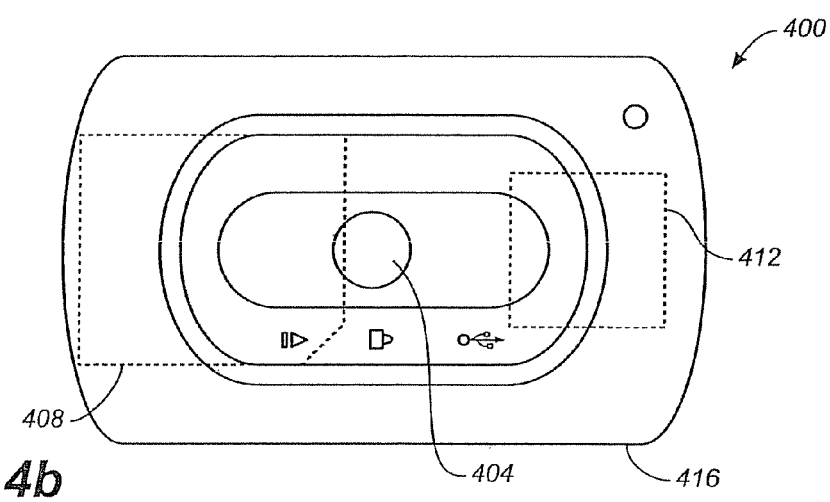
FIG. 4b is a diagrammatic representation of an adapter, e.g., adapter 400 of FIG. 4a, in a travel configuration in accordance with an embodiment of the present invention.

Since memory card 408 extends past the edges of body 416 when adapter 400 is in a loading position, while connector 412 is protected, memory card 408 is exposed and, hence, may be damaged while adapter 400 is being transported. FIG. 4b is a diagrammatic representation of adapter 400 in a travel position in which memory card 408 is substantially retracted within body 416 in accordance with an embodiment of the present invention. Switch 404 is located in a travel, or locked, position in which both memory card 408 and connector 412 are retracted within body 416. It should be appreciated that while connector 412 is also retracted within body 416 when adapter 400 is in a loading position, as discussed above with respect to FIG. 4a, the position of connector 412 within body 416 when adapter 400 is in a travel position differs from the position of connector 412 within body 416 when adapter 400 is in a loading position.

When both connector 412 and memory card 408 are retracted with respect to body 416, i.e., when substantially no part of connector 412 or memory card 408 extends outside of a boundary established by body 416, connector 412 and memory card 408 are effectively protected from being damaged, e.g., bent, or cracked, in the event that adapter 400 is moved. As such, a user may transport adapter 400 from one location to another substantially without worrying that damage may be inflicted on either connector 412 or memory card 408.

Figure 4C:
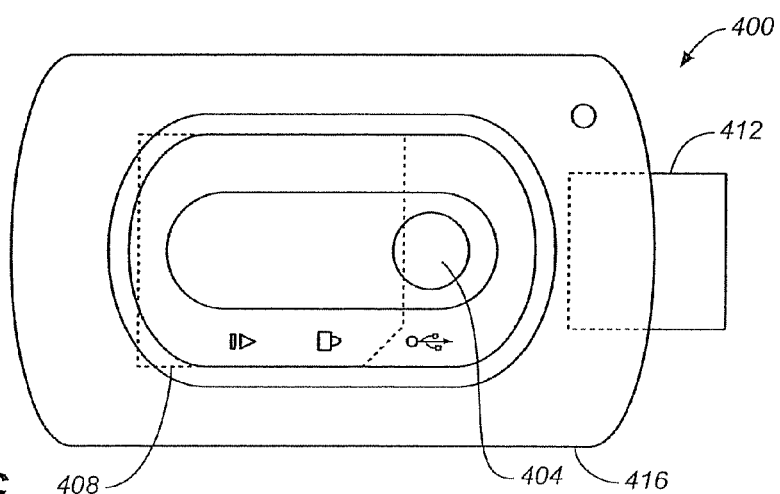
FIG. 4c is a diagrammatic representation of an adapter, e.g., adapter 400 of FIG. 4a, in a use configuration in accordance with an embodiment of the present invention.

In the described embodiment, in order for connector 412 to be coupled to a port on a host device, either directly or through a cable, connector 412 is exposed, i.e., extended such that at least a portion of connector 412 protrudes from body 416 or extends past a boundary established by body 416. FIG. 4c is a diagrammatic representation of adapter 400 in a use position in which memory card 408 is substantially retracted within body 416 while connector 412 protrudes from body 416 in accordance with an embodiment of the present invention. When button 404 is in a use position, connector 412 protrudes past the outline, e.g., external boundary, of body 416.

Connector 412 is extended when adapter 400 is in a use position such that at least a portion of connector 412 extends past the outline of body 416. When connector 412 is extended, connector 412 is exposed such that connector 412 may be readily coupled to a port, e.g., a USB port of a host device or a port associated with an extension cable. Memory card 408 is retracted further into body 416 when adapter 400 is in a use position than when adapter 400 is in a travel position, since a sliding element (not shown) that substantially physically couples memory card 408 to connector 412 causes connector 412 to extend and, as a result, causes memory card 408 to further retract.

Figure 5A:
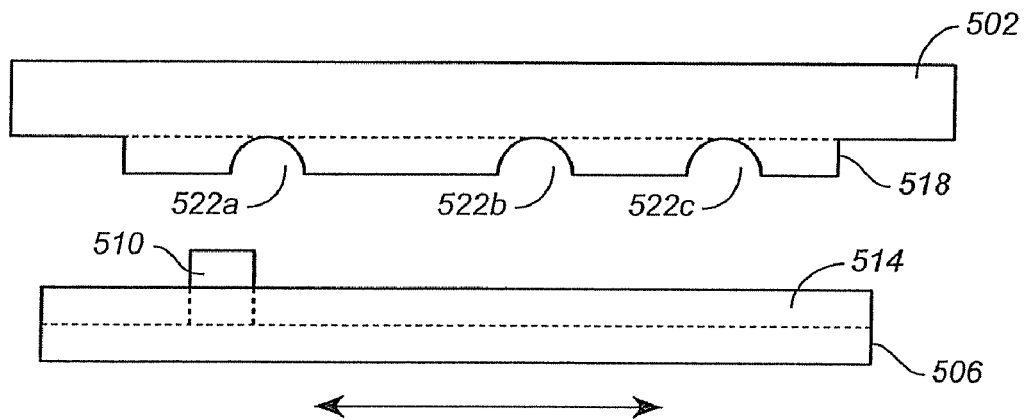
FIG. 5a is a schematic representation of the general components of a detent mechanism in accordance with an embodiment of the present invention.

A suitable mechanism for enabling the loading position, the travel position, and the use position to be achieved is a detent mechanism, as mentioned above. A detent mechanism generally enables a sliding element to move within an adapter and to latch into different positions. With reference to FIG. 5a, the general components of a detent mechanism will be described in accordance with an embodiment of the present invention. A guiding rail 518 is coupled to a surface of a top body portion 502. Although a material such as ABS is generally used to form guiding rail 518 and top body portion 502, it should be appreciated that substantially any suitable material may be used to form guiding rail 518 and top body portion 502. Guiding rail 518 includes indentations 522 which are arranged to accommodate a nub 510 that is associated with a surface of a top sliding element 506. Nub 510 is positioned within a channel 514 that is apart of top sliding element 506. Channel 514 and nub 380 substantially correspond to channel 390 and nub 380 of FIG. 3.

If top sliding element 506 is being translated, as for example to locate a suitable latching position, top sliding element 506 may be in a position such that substantially no part of top sliding element 506 comes into contact with top body portion 502, as shown. It should be appreciated that the spacing between top body portion 502 and top sliding element 506 has been exaggerated for purposes of discussion. Typically, however, nub 510 may effectively slide along guiding rail 518 until nub 510 encounters an indentation 522, at which time nub 510 may become engaged by the encountered indentation 522.

Figure 5B:
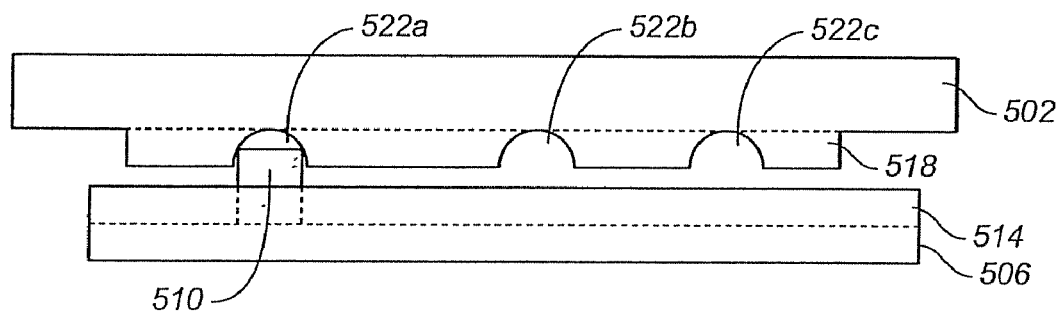
FIG. 5b is a schematic representation of the general components of a detent mechanism in which the detent mechanism is engaged in a first position in accordance with an embodiment of the present invention.

When top sliding element 506 is latched into place with respect to top body portion 502, nub 380 may be positioned within an indentation 522 such as indentation 522a, as shown in FIG. 5b. Nub 510 may be engaged by or latched within indentation 522a when force used to move top sliding element 506 is removed. The presence of channel 514 in top sliding element 506 allows the engagement of nub 510 to be maintained relatively reliably, as nub 506 is effectively taller and less likely to become dislodged, particularly when guiding rail 518 is configured to be at least partially positioned within channel 514 (not shown) when nub 510 is engaged in an indentation 522.

The location of each indentation 522 or notch corresponds to a position of an overall sliding element which includes top sliding element 506. By way of example, when nub 510 is positioned in indentation 522a, as shown, an overall sliding element may be positioned within a body which includes top body portion 502 such that a connector and a card socket, e.g., connector 326 and card socket 322 of FIG. 2, are in a loading position. Alternatively, when nub 510 is engaged in indentation 522b, then a connector and a card socket associated with the overall sliding element may be in a travel or locked position. The connector and a card socket substantially carried by the overall sliding element are effectively in a use position when nub 510 is engaged in indentation 522c.

Figure 6:
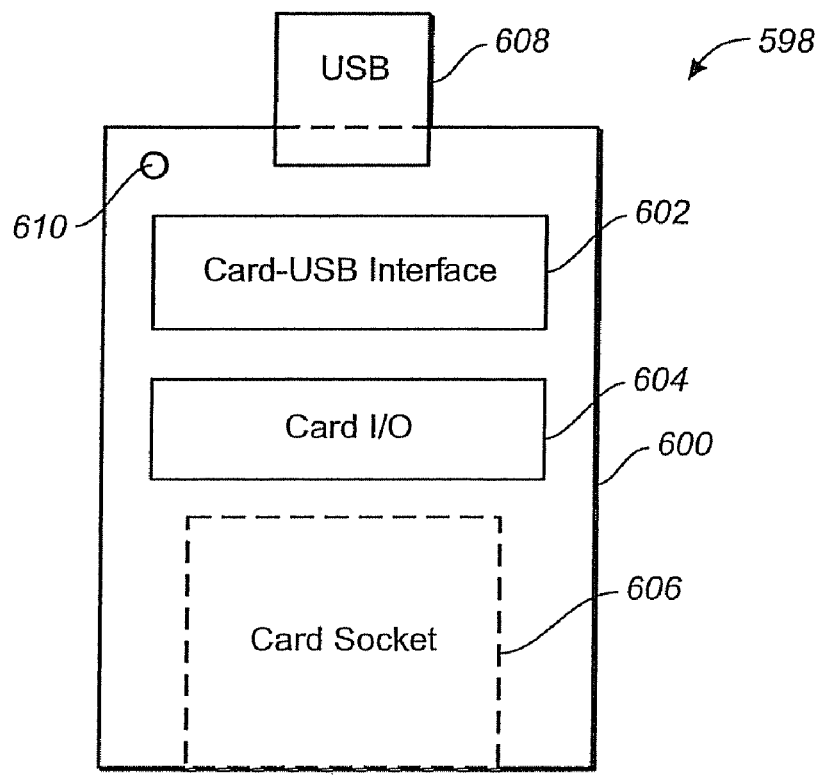
FIG. 6 is a diagrammatic block diagram representation of the functional blocks associated with a circuit board assembly of a three-position adapter in accordance with an embodiment of the present invention.

As previously mentioned, a circuit board which is held within an overall sliding element of an adapter includes various components which effectively provide the functionality which enables a memory card to communicate with a connector and, hence, with substantially any device that is coupled to the connector. FIG. 6 is a diagrammatic block diagram representation of the functional blocks associated with a circuit board assembly of a three-position adapter in accordance with an embodiment of the present invention. A circuit board assembly 598 includes a circuit board 600 on which a connector 608 is mounted. In the described embodiment, connector 608 may be a USB connector, although connector 608 may generally be substantially any suitable type of connector. Other suitable types of connectors include, but are not limited to, parallel port connectors and serial port connectors. Circuit board 600 generally includes multiple layers of traces which may be electrically coupled through interconnects.

Circuit board assembly 598 includes a card socket 606 which is arranged to accept and to substantially hold a memory card (not shown). A card input/output (I/O) block 604 is arranged to interface with I/O pins associated with the memory card inserted in card socket 606. For example, when card socket 606 is arranged to receive a Secure Digital card, card I/O block 604 may be arranged to access a Secure Digital card. Likewise, when card socket 606 is arranged to receive a MultiMedia card or a Compact Flash card, card I/O block 604 may be arranged to access a MultiMedia card or a Compact Flash card, respectively.

A card-connector interface 602, e.g., a card-USB interface, generally includes firmware which enables signals received through connector 608 to be properly provided to card I/O block 604 and, hence, to a memory card inserted in card socket 606. As will be appreciated by those skilled in the art, card-connector interface 602 is also arranged to enable signals to be provided from a memory card inserted in card socket 606 to connector 608. In one embodiment, circuit board 600 also includes a light emitting diode (LED) 610 which is arranged to emit light when signals are being transferred between connector 608 and a memory card positioned in card socket 606. That is, LED 610 may be arranged to indicate when a memory card inserted in card socket 606 is in the process of being accessed or used, or if the memory card is merely present in card socket 606.

Figure 7:
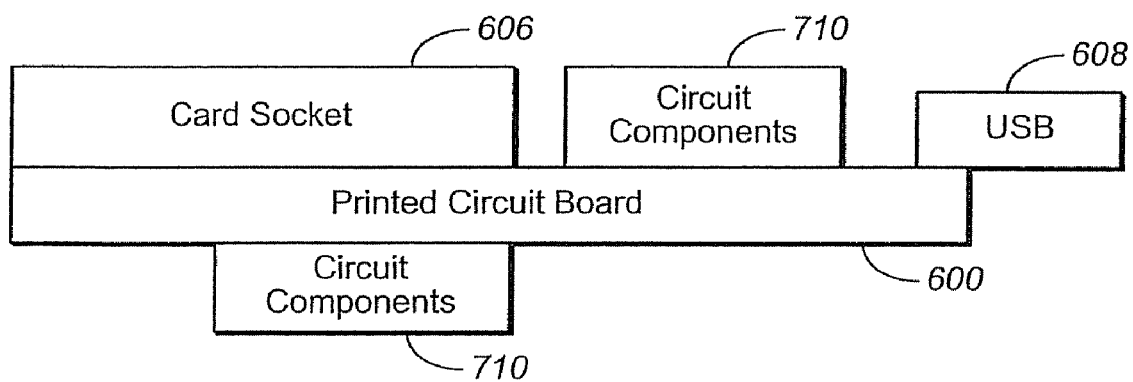
FIG. 7 is a diagrammatic representation of the orientation of components on a circuit board, e.g., circuit board 600 of FIG. 6, in accordance with an embodiment of the present invention.

Referring next to FIG. 7, the orientation of components on a circuit board, e.g., circuit board 600 of FIG. 6, will be described in accordance with an embodiment of the present invention. Card socket 606 and connector 608 which are mounted substantially on a top surface of circuit board 600, although card socket 606 and connector 608 may generally be mounted substantially anywhere with respect to circuit board 600. Various circuit components 710 are mounted on surfaces of circuit board 600, as shown. Circuit components 710 include components which provide the functionality of card I/O block 604 of FIG. 6 and card-connector interface 602 of FIG. 602. While circuit components 710 may include a variety of different components depending upon the requirements of an overall adapter, circuit components 710 generally include various application specific integrated circuits (ASICs), chips, crystals, and other discrete components.

Figure 8A:
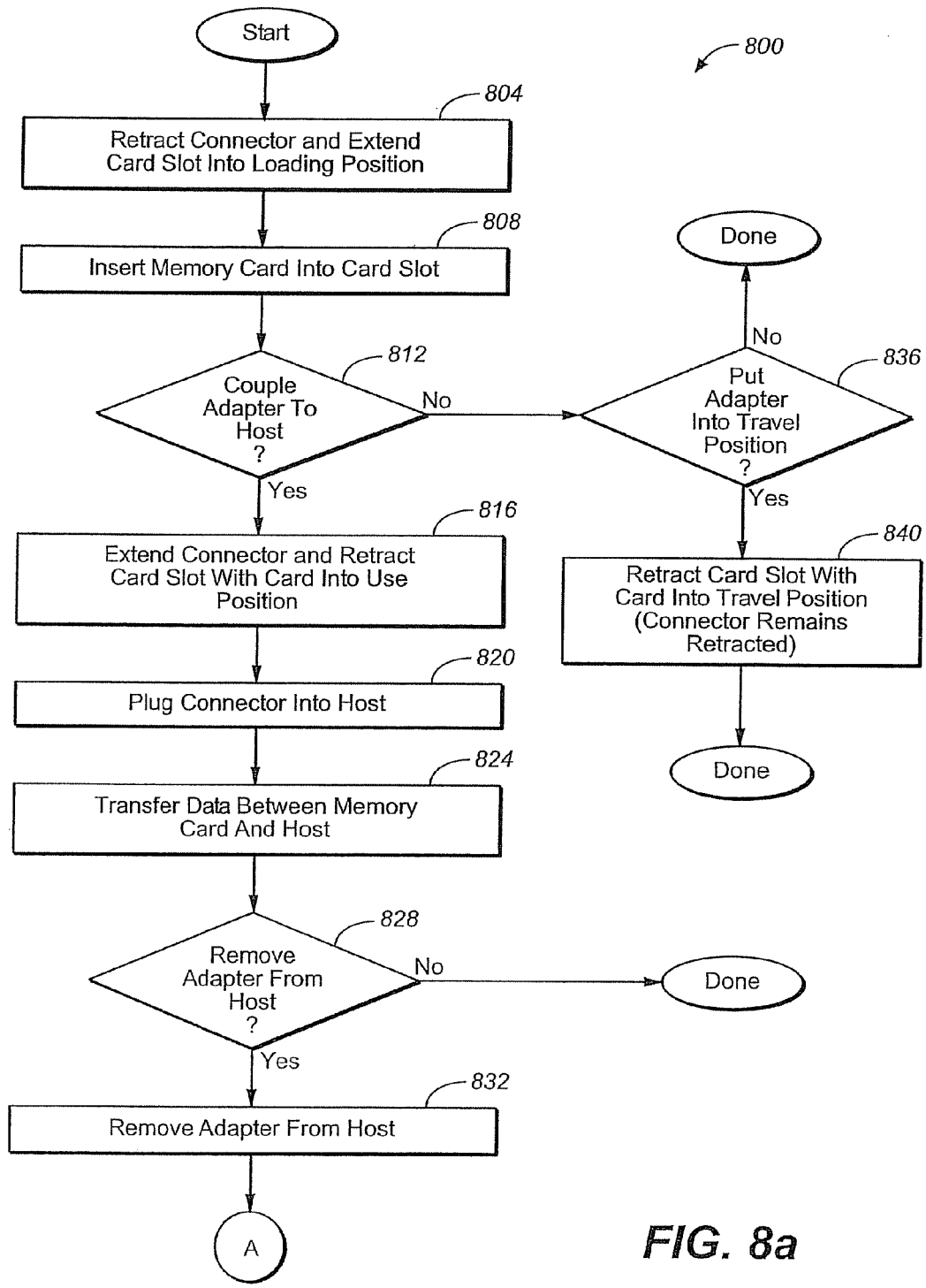
FIGS. 8a and 8b are a process flow diagram which illustrates the steps associated with one method of using a three-position adapter will be described in accordance with an embodiment of the present invention.
Figure 8B:
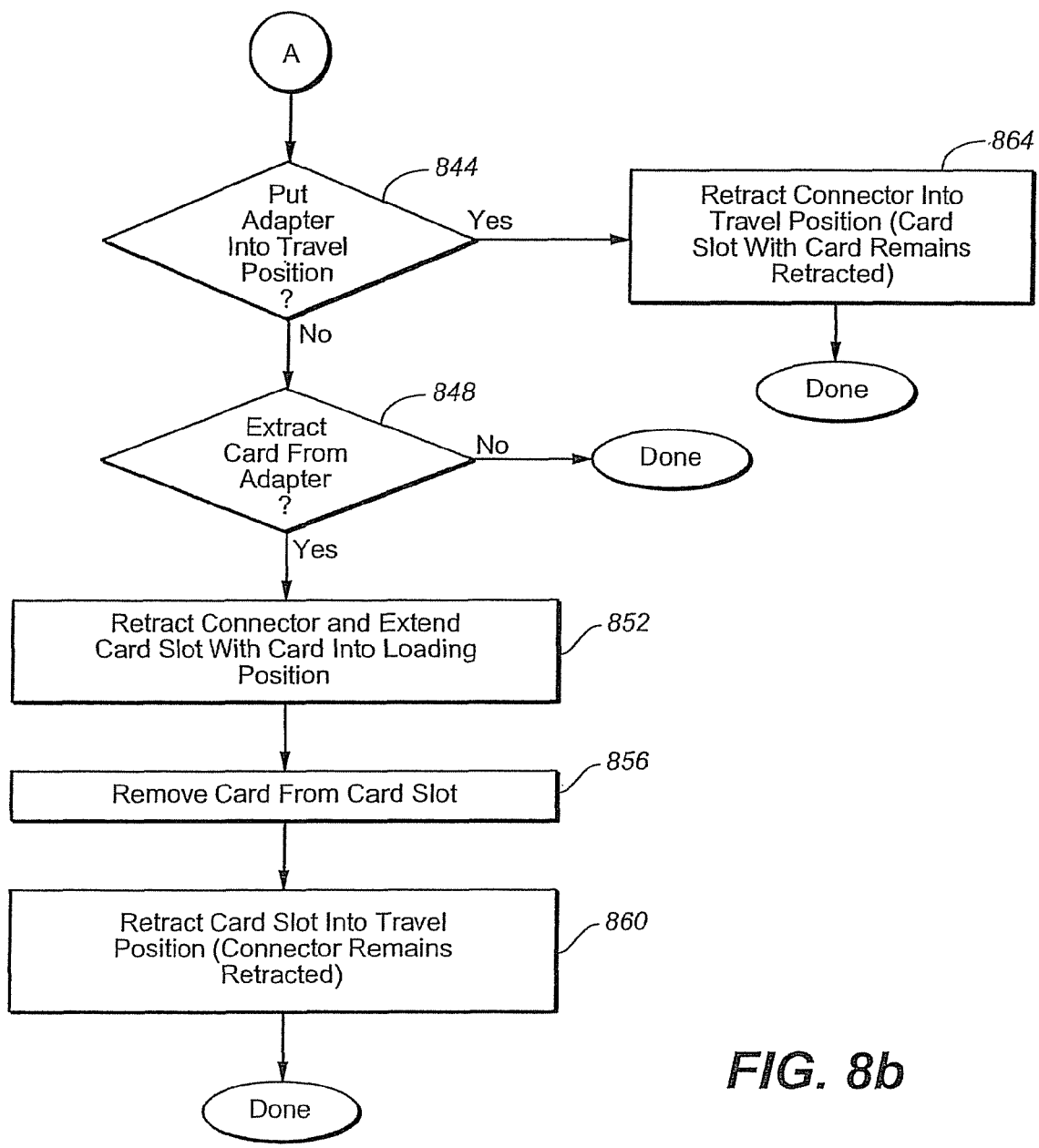

With reference to FIGS. 8a and 8b, the steps associated with one method of using a three-position adapter will be described in accordance with an embodiment of the present invention. A process 800 of using an adapter begins at step 804 in which the adapter is placed into a loading position to enable a memory card, e.g. a Secure Digital card or a MultiMedia card, to be inserted into the adapter. Placing the adapter into a loading position generally involves ensuring that the connector is retracted into the body of the adapter, and ensuring that the card slot is positioned to enable the memory card to be inserted and engaged. It should be appreciated that extending the card slot to enable the memory card to be inserted and engaged does not necessarily involve causing the card slot to protrude from the body of the adapter. For example, in one embodiment, when the card slot is extended such that a memory card may effectively be inserted into the card slot, the card slot is still substantially within the body of the adapter.

Once the adapter is placed in a loading position, a memory card may be inserted or otherwise loaded into the card slot in step 808. As discussed above, loading the memory card into the card slot may include allowing contact forces between the memory card and the card slot to effectively cause the card to be engaged by the card slot. When the memory card is loaded into the card slot, a determination is made in step 812 regarding whether to couple the adapter to a host device, e.g., a computing system. If it is determined that the adapter is not to be coupled to the host, then the implication may be that the card has been inserted into the adapter such that the card may be protected by the adapter. Accordingly, when it is determined that the adapter is not to be coupled to a host in step 812, process flow proceeds to step 836 in which it is determined whether the adapter is to be put into a travel position. In other words, if the adapter is not to be coupled to a host, then a determination is made in step 836 as to whether the memory card is to be retracted into the body of the adapter. If it is determined that the adapter is not to be configured in a travel position, then the indication may be that the memory card has been inserted into the card slot for the sake of keeping the adapter and the memory card together. As such, the process of using the adapter is completed.

Alternatively, if it is determined in step 836 that the adapter is to be put into a travel position, the indication is that the memory card and the adapter are to be transported together. Accordingly, process flow moves from step 835 to step 840 in which the card slot is retracted into the adapter while the connector remains retracted. It should be understood that retracting the card slot causes the memory card to be retracted into the adapter. Once the card slot and the memory card are retracted, the adapter and the memory card may essentially be transported as a single unit with neither the memory card nor the connector protruding from the body of the adapter, and the process of using the adapter is completed.

Returning to step 812, when the determination is that the adapter is to be coupled to the host, the connector associated with the adapter is extended in step 816 while the card slot with the memory card in place is retracted. That is, the adapter is configured into a use position. After the adapter is configured into a use position and, hence, the connector associated with the adapter is extended such that the connector protrudes from the body of the adapter, the connector may effectively be plugged into the host in step 820. In general, although the connector may be plugged directly into the host, e.g. a USB connector associated with the adapter may be plugged directly into a USB port of the host, an extension cable may be used to couple the connector to the host.

Once the connector is plugged into or otherwise interfaced with the host, data may be transferred between the memory card and the host in step 824 through the use of the adapter. The host may write information onto memory included in the memory card, or the host may read information from the memory. When the transfer of data between the memory card and the host is completed, a determination is made in step 828 regarding whether the adapter is to be removed from, e.g., decoupled from, the host. If it is determined that the adapter is not to be removed from the host, then the adapter remains coupled to the host, thereby enabling data to be transferred between the host and the memory card at substantially any time, the process of using the adapter is completed.

Alternatively, if it is determined in step 828 that the adapter is to be removed from the host, then the adapter is removed or otherwise decoupled from the host in step 832. After the adapter is removed, it is determined in step 844 if the adapter is to be placed into a travel position. If it is determined that the adapter is to be placed into a travel position, then the connector is retracted in step 864, while the memory card remains retracted. The process of using the adapter terminates once the connector is retracted and, as a result, the adapter is in a travel position.

On the other hand, if it is determined that the adapter is not to be placed into a travel position, then it is determined in step 848 if the memory card is to be extracted from the adapter. If the memory card is not to be extracted from the adapter, then the indication is that it is desired for the adapter to remain in a use position with the memory card in the card slot. As such, the process of using the adapter terminates with the adapter in a use position.

When it is determined in step 848 that the memory card is to be extracted from the adapter, the connector is retracted while the card slot is extended in step 852. In other words, in order to enable the memory card to be extracted, the adapter is configured into a loading position which enables the memory card to be removed from the card slot. The memory card is then removed from the card slot in step 856. After the memory card is removed from the card slot, in the described embodiment, the card slot is retracted while the connector remains retracted in step 860, i.e., the adapter is configured in a travel position. Once the adapter is configured in a travel position, the process of using the adapter is completed.

Figure 9:
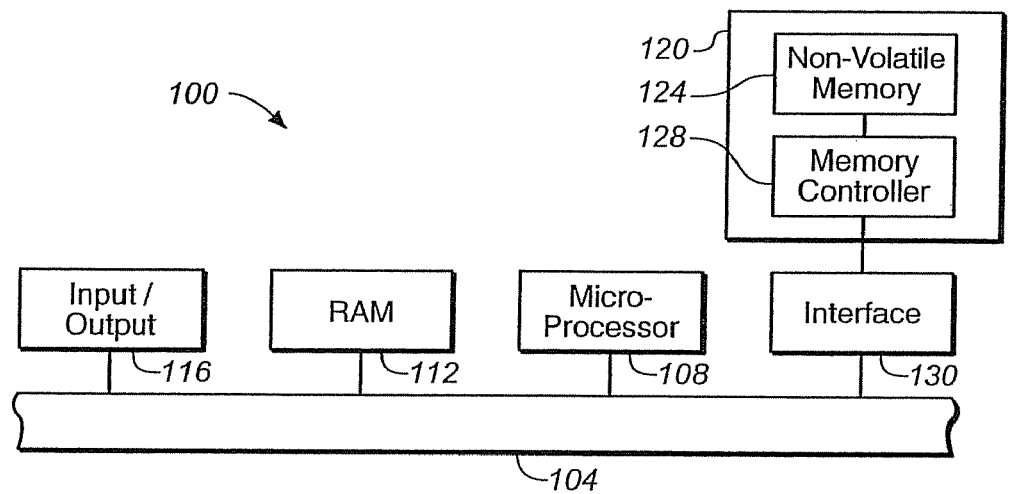
FIG. 9 is a diagrammatic representation of a general host system which includes a non-volatile memory device in accordance with an embodiment of the present invention.

When the non-volatile memory device is interfaced within or with a host system through a three-position adapter, the host system may communicate with the non-volatile memory device to cause bits to be written to, read from, or erased within the non-volatile memory device through the adapter. Referring initially to FIG. 9, a general host system that includes a non-volatile memory device, e.g., a CompactFlash memory card, will be described. A host or computer system 100 generally includes a system bus 104 which allows a microprocessor 108, a random access memory (RAM) 112, and input/output circuits 116 to communicate. It should be appreciated that host system 100 may generally include other components, e.g., display devices and a networking device, which are not shown for purposes of illustration.

In general, host system 100 may be capable of capturing information including, but not limited to, still image information, audio information, and video image information. Such information may be captured in real-time, and may be transmitted to host system 100 in a wireless manner. While host system 100 may be substantially any system, host system 100 is typically a system such as a digital camera, a video camera, a cellular communications device, an audio player, a video player, or a computer system. It should be appreciated, however, that host system 100 may generally be substantially any system which stores data or information, and retrieves data or information.

Host system 100 may also be a system that either only captures data, or only retrieves data. That is, host system 100 may be a dedicated system which stores data, or host system 100 may be a dedicated system which reads data. By way of example, host system 100 may be a memory writer which is arranged substantially only to write or store data. Alternatively, host system 100 may be a device such as an MP3 player which is typically arranged to read or retrieve data, but not to capture data.

A non-volatile memory device 120, in one embodiment, is a removable non-volatile memory device that is typically arranged to interface with bus 104 to store information through an input/output circuit interface 130. Input/output interface 130, which is typically a reader or an adapter, may serve to reduce loading on bus 104, as will be understood by those skilled in the art. Non-volatile memory device 120 includes non-volatile memory 124 and a memory control system 128. In one embodiment, non-volatile memory device 120 may be implemented on a single chip or a die. Alternatively, non-volatile memory device 120 may be implemented on a multi-chip module, or on multiple discrete components which may be used together as non-volatile memory device 120. One embodiment of non-volatile memory device 120 will be described below in more detail with respect to FIG. 10.

Non-volatile memory 124 is arranged to store data such that data may be accessed and read as needed. Data stored in non-volatile memory 124 may also be erased as appropriate, although it should be understood that some data in non-volatile memory 124 may not be erasable. The processes of storing data, reading data, and erasing data are generally controlled by memory control system 128.

Non-volatile memory device 120 has generally been described as including a memory control system 128, i.e., a controller. Often, non-volatile memory device 120 may include separate chips for non-volatile memory 124 and memory control system 128, i.e., controller, functions. By way of example, while non-volatile memory devices including, but not limited to, PC cards, CompactFlash cards, MultiMedia cards, and secure digital cards include controllers which may be implemented on a separate chip, other non-volatile memory devices may not include controllers that are implemented on a separate chip. In an embodiment in which non-volatile memory device 120 does not include separate memory and controller chips, the memory and controller functions may be integrated into a single chip, as will be appreciated by those skilled in the art.

Figure 10:
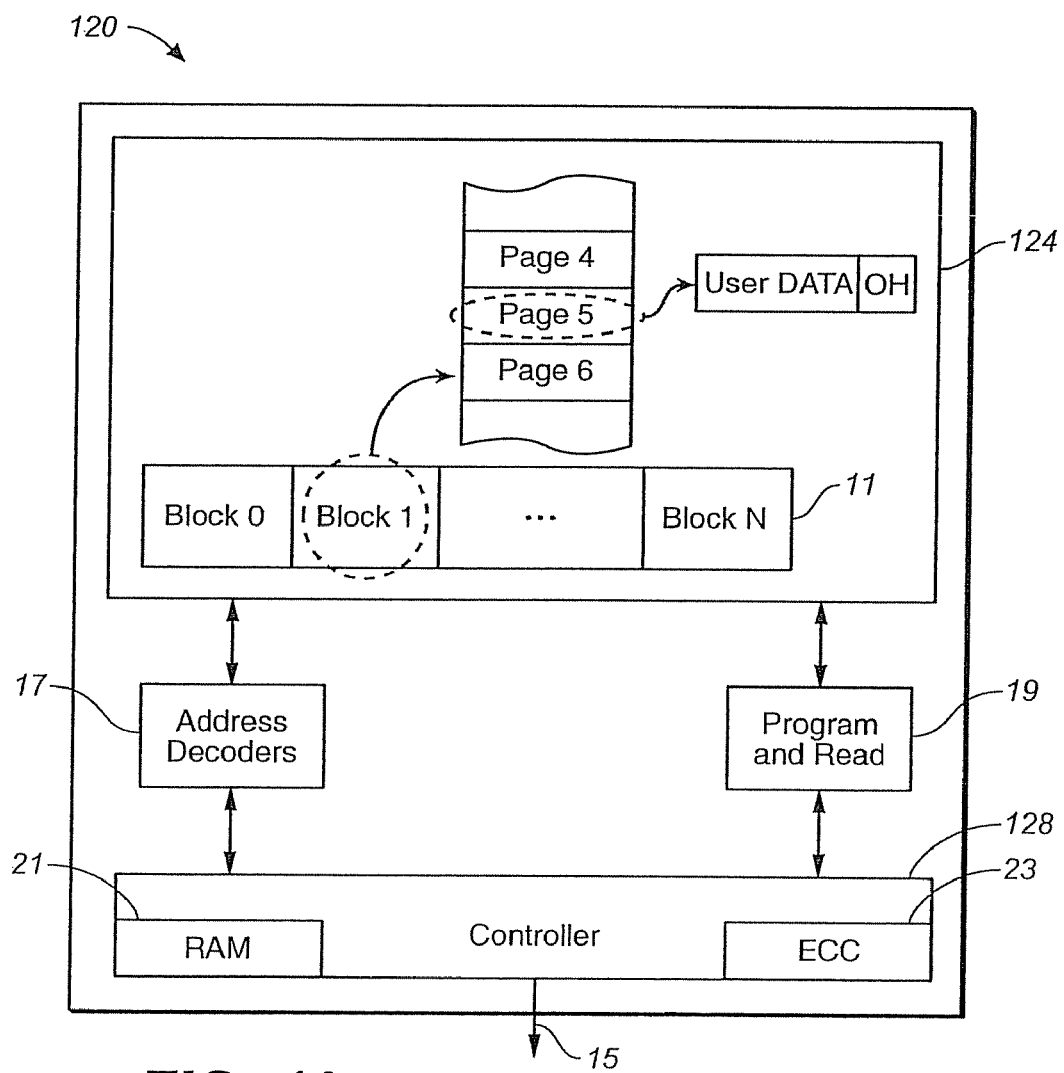
FIG. 10 is a diagrammatic representation of a non-volatile memory device, i.e., non-volatile memory device 120 of FIG. 9, in accordance with an embodiment of the present invention.

With reference to FIG. 10, non-volatile memory device 120 will be described in more detail in accordance with an embodiment of the present invention. As described above, non-volatile memory device 120 includes non-volatile memory 124 and memory control system 128. Memory 124 and control system 128, or controller, are primary components of non-volatile memory device 120. Memory 124 may be an array of memory cells formed on a semiconductor substrate, wherein one or more bits of data are stored in the individual memory cells by storing one of two or more levels of charge on individual storage elements of the memory cells. A non-volatile flash electrically erasable programmable read only memory (EEPROM) is an example of a common type of memory for such systems.

Control system 128 communicates over a bus 15 to a host computer or other system that is using the memory system to store data. Bus 15 is generally a part of bus 104 of FIG. 9. Control system 128 also controls operation of memory 124, which may include a memory cell array 11, to write data provided by the host, read data requested by the host and perform various housekeeping functions in operating memory 124. Control system 128 generally includes a general-purpose microprocessor which has associated non-volatile software memory, various logic circuits, and the like. One or more state machines are often also included for controlling the performance of specific routines.

Memory cell array 11 is typically addressed by control system 128 through address decoders 17. Decoders 17 apply the correct voltages to gate and bit lines of array 11 in order to program data to, read data from, or erase a group of memory cells being addressed by the control system 128. Additional circuits 19 include programming drivers that control voltages applied to elements of the array that depend upon the data being programmed into an addressed group of cells. Circuits 19 also include sense amplifiers and other circuits necessary to read data from an addressed group of memory cells. Data to be programmed into array 11, or data recently read from array 11, are typically stored in a buffer memory 21 with control system 128. Control system 128 also usually contains various registers for temporarily storing command and status data, and the like.

Array 11 is divided into a large number of BLOCKS 0-N of memory cells. As is common for flash EEPROM systems, the block is the unit of erase. That is, each block contains the minimum number of memory cells that are erased together. Each block is typically divided into a number of pages, as also illustrated in FIG. 9. A page is the unit of programming. That is, a basic programming operation writes data into a minimum of one page of cells. One or more sectors of data are typically stored within each page. As shown in FIG. 10, one sector includes user data and overhead data. Overhead data typically includes an error correction code (ECC) that has been calculated from the user data of the sector. A portion 23 of the control system 128 calculates the ECC when data is being programmed into array 11, and also checks the ECC when data is being read from array 11. Alternatively, the ECCs are stored in different pages, or different blocks, than the user data to which they pertain.

A sector of user data is typically 512 bytes, corresponding to the size of a sector in magnetic disk drives. Overhead data is typically an additional 28 bytes. One sector of data is most commonly included in each page but two or more sectors may instead form a page. A large number of pages form a block, anywhere from eight pages, for example, up to 512, 1024 or more pages. The number of blocks is chosen to provide a desired data storage capacity for the memory system. Array 11 is typically divided into a few sub-arrays (not shown), each of which contains a proportion of the blocks, which operate somewhat independently of each other in order to increase the degree of parallelism in the execution of various memory operations. An example of the use of multiple sub-arrays is described in U.S. Pat. No. 5,890,192, which is incorporated herein by reference in its entirety.

Although only a few embodiments of the present invention have been described, it should be understood that the present invention may be embodied in many other specific forms without departing from the spirit or the scope of the present invention. By way of example, the detent mechanism which is used to enable a sliding element to translate within a body of an adapter and to effectively be locked into different positions within the body may be widely varied. Further, substantially any other suitable positioning mechanism may be used in lieu of a detent mechanism to enable a sliding element to move between different positions.

While a nub that engages a guiding rail to form a detent mechanism has generally been described as being seated in a channel, it should be appreciated that a nub is not necessarily seated in a channel. That is, a nub may be a protrusion from a top surface of a sliding element. Additionally, although the use of a plurality of channels, nubs, and corresponding guiding rails has been described as being included in a detent mechanism, the number of channels, nubs, and guiding rails may vary widely. For example, a single channel with a single nub and a corresponding guiding rail may form a detent mechanism.

In lieu of substantially incorporating a guiding rail into a body and a nub with a channel into a sliding element, the guiding rail may instead be incorporated into the sliding element while the nub with the channel may be incorporated into the body. That is, in general, the components of a detent mechanism may be incorporated into substantially any suitable part of an adapter.

A sliding element is typically a flexible element which may be pressed on to enable a detent mechanism to latch, as mentioned above. However, the configuration of a sliding element may vary. In one embodiment, rather then being formed as a flexible element, the sliding element may include a piece which is loaded on a spring. The piece, on which any nubs associated with the detent mechanism may be formed, may be pressed on such that the compression forces are applied to the spring to cause the spring to compress. When the spring compresses, the sliding element may be moved such that the detent mechanism may latch when compression forces on the spring are removed.

An adapter has generally been described as being a three-position adapter. It should be appreciated, however, that the number of positions or configurations which an adapter may have may vary. For instance, in an embodiment in which an adapter is generally not transported with a memory card inserted within the adapter, the adapter may include substantially only a loading configuration and a use configuration. That is, a detent mechanism or a similar mechanism associated with the adapter may be arranged to facilitate the adapter in a position in which a memory card is partially exposed while a connector is protected, and a position in which the memory card is protected while the connector is exposed.

Alternatively, in another embodiment, an adapter may include a loading position which is substantially the same as a travel position, and a use position. By way of example, a loading position may include inserting a memory card into an adapter such that effectively no part of the adapter extends past the outline of the body of the adapter. The loading position may then be the same as a travel position, as neither the memory card nor the adapter is exposed. When substantially no part of the memory card is exposed when the adapter is in a loading position, an ejection mechanism may be included in the adapter to enable the memory card to be removed from the adapter.

In some instances, it may be desirable to incorporate a cable to the connector which is associated with an adapter. When a cable is to be incorporated as a part of the adapter, the cable may be arranged to be retracted when the adapter is not in a use position. The cable may also be arranged to be substantially wound around the adapter, and the adapter may be arranged to include an opening into which a connection portion of the cable, i.e., the part of the cable which is to be interfaced with a port on a host device, may be inserted when the adapter is not coupled to the host device.

While a card socket which holds a memory card in place has been described as being arranged to use contact forces to engage the memory card, it should be appreciated that the mechanism used to engage the memory card may vary widely without departing from the spirit or the scope of the present invention. By way of example, a mechanism which uses spring forces to engage a memory card may be incorporated into an adapter of the present invention. In other words, a mechanism which engages the memory card may include a spring loaded component.

The body of an adapter may include various features which may further protect either or both a memory card and a connector from being damaged. For instance, the body may include a flap or a similar piece which is arranged to cover the opening of the body through which a memory card may be inserted, e.g. opening 214 of FIG. 1. The flap may prevent particles such as dust particles from entering the adapter through the opening. When a body includes a flap, the flap may be pushed by a memory card when the memory card is inserted through the opening. When the memory card is retracted into the body, the flap may be returned to its default position, i.e., the flap may once again cover the opening, to farther protect the memory card and to prevent particles from passing through the opening. Similarly, a flap which may be pushed outward or inward by a connector may be used to protect the connector The mechanism that is used to enable an adapter to be configured in different positions may be a sliding element which holds both a connector and a memory card, as discussed above. The sliding element uses a detent mechanism to locate the connector and the memory card with respect to the overall outline of a body of the adapter. Other mechanisms which enable an adapter to be configured in different positions include mechanisms which pivot between different configurations or states and mechanisms which use a combination of pivoting or rotation and sliding to move between different configurations.

In general, the steps associated with the various processes of the present invention may be widely varied. Steps may be reordered, altered, added, and removed without departing from the spirit or the scope of the present invention. Therefore, the present examples are to be considered as illustrative and not restrictive, and the invention is not to be limited to the details given herein, but may be modified within the scope of the appended claims.

What is claimed is:

1. A method of interfacing a non-volatile memory device with a host device using an adapter to enable information to be transferred between the non-volatile memory device and the host device, the adapter including a receptacle arranged to receive the non-volatile memory device and a connector arranged to interface with the host device, the method comprising:
   inserting the non-volatile memory device into the receptacle, wherein the connector is substantially retracted within the adapter when the non-volatile memory device is inserted into the receptacle; and
   retracting the non-volatile memory device into the adapter, wherein when the nonvolatile memory device is retracted, the receptacle is moved within the adapter through movement of a circuit board; and the circuit board moving the connector within the adapter when the non-volatile memory device is being retracted.

2. The method of claim 1 wherein moving the connector within the adapter includes extending the connector at least partially out of the adapter.

3. The method of claim 2 further including:
   coupling the connector to the host device when the connector is extended at least partially out of the adapter.

4. The method of claim 1 wherein the connector is a universal serial bus connector.

5. The method of claim 1 wherein the non-volatile memory device is a memory 30 card which includes a non-volatile memory.

6. The method of claim 5 wherein the memory card is one selected from the group consisting of a secure digital card, a Compact Flash card, a multimedia card, a smart media card, and a Memory Stick card.

7. An apparatus arranged to enable a non-volatile memory device to communicate with a host device comprising:
   a body, the body having a boundary; and
   an element, the element being arrange to move at least partially within the body, the element including an interface which is arranged to be coupled to the host device when the element is in a first position with respect to the body, the element further being arranged to receive the non-volatile memory device and the interface with respect to the body, wherein the element includes a receiver, the receiver being arranged to receive the non-volatile memory device, wherein when the element is in a second position with respect to the body, the interface and the receiver are both positioned substantially within the boundary, and wherein the body includes a guiding rail and the element includes a protrusion, the guiding rail being arranged to include a first notch and a second notch, the protrusion being arranged to be engaged by the first notch to substantially hold the element in the first position with respect to the body and arranged to be engaged by the second notch to substantially hold the element in the second position.

* * * * *